(12) United States Patent
Gross et al.

(10) Patent No.: US 8,275,738 B2
(45) Date of Patent: Sep. 25, 2012

(54) RADIO FREQUENCY MICROSCOPE FOR AMPLIFYING AND ANALYZING ELECTROMAGNETIC SIGNALS BY POSITIONING THE MONITORED SYSTEM AT A LOCUS OF AN ELLIPSOIDAL SURFACE

(75) Inventors: Kenny C. Gross, San Diego, CA (US); Ramakrishna C. Dhanekula, San Diego, CA (US); David K. McElfresh, San Diego, CA (US)

(73) Assignee: Oracle America, Inc., Redwood Shores, CA (US)

(*) Notice: Subject to any disclaimer, the term of this patent is extended or adjusted under 35 U.S.C. 154(b) by 695 days.

(21) Appl. No.: 12/473,173

(22) Filed: May 27, 2009

(65) Prior Publication Data
US 2010/0306165 A1 Dec. 2, 2010

(51) Int. Cl.
G06F 15/00 (2006.01)
(52) U.S. Cl. .......................................................... 706/62
(58) Field of Classification Search .................... 706/12, 706/52, 62, 916; 977/852; 324/501, 537, 324/76.11
See application file for complete search history.

(56) References Cited

U.S. PATENT DOCUMENTS

| | | | |
|---|---|---|---|
| 6,580,391 B1 * | 6/2003 | Kepley et al. ................. | 342/359 |
| 6,611,238 B1 * | 8/2003 | Santoru et al. ................ | 343/840 |
| 7,188,037 B2 * | 3/2007 | Hidehira ........................ | 702/58 |
| 7,613,580 B2 * | 11/2009 | Gross et al. .................... | 702/89 |
| 2006/0043979 A1 * | 3/2006 | Wu ................................ | 324/627 |
| 2009/0125467 A1 * | 5/2009 | Dhanekula et al. ............. | 706/20 |
| 2009/0150324 A1 * | 6/2009 | Dhanekula et al. ............. | 706/52 |
| 2009/0292490 A1 * | 11/2009 | McElfresh et al. ............. | 702/66 |
| 2009/0306920 A1 * | 12/2009 | Zwinger et al. ................ | 702/77 |
| 2010/0023282 A1 * | 1/2010 | Lewis et al. .................... | 702/57 |
| 2010/0161525 A1 * | 6/2010 | Gross et al. .................... | 706/12 |
| 2010/0305892 A1 * | 12/2010 | Gross et al. .................... | 702/66 |
| 2010/0332199 A1 * | 12/2010 | Dhanekula et al. ............. | 703/2 |

OTHER PUBLICATIONS

Chartier et al., Elecromagnetic Interference Measurements at 900 MHz on 230-KV and 500-KV Transmission Lines, 1986, IEEE, pp. 140-149.*
Salamati et al., Electromagnetic Signatures as a Tool for Connectionless Test, 2003, IEEE CS, pp. 26-30.*
D'Amore et al., A Neural Network Approach for Identification of EM Field Sources: Analysis of PCB Configurations, 1998, IEEE, p. 664-669.*
Peng et al., The Technical Scheme for FAST, 1999, Perspectives on Radio Astronomoy, p. 43-48.*

* cited by examiner

Primary Examiner — David Vincent
(74) Attorney, Agent, or Firm — Park, Vaughan, Fleming & Dowler LLP; Chia-Hsin Suen

(57) ABSTRACT

One embodiment provides a technique for analyzing a target electromagnetic signal radiating from a monitored system. During the technique, the monitored system is positioned at a first locus of an ellipsoidal surface to amplify the target electromagnetic signal received at a second locus of the ellipsoidal surface. Next, the amplified target electromagnetic signal is monitored using an antenna positioned at the second locus of the ellipsoidal surface. Finally, the integrity of the monitored system is assessed by analyzing the amplified target electromagnetic signal monitored by the antenna.

21 Claims, 3 Drawing Sheets

RADIO FREQUENCY MICROSCOPE FOR AMPLIFYING AND ANALYZING ELECTROMAGNETIC SIGNALS BY POSITIONING THE MONITORED SYSTEM AT A LOCUS OF AN ELLIPSOIDAL SURFACE

BACKGROUND

1. Field

The present embodiments relate to techniques for analyzing target electromagnetic signals radiating from monitored systems. More specifically, the present embodiments relate to a method and system for amplifying the target electromagnetic signals using an ellipsoidal surface in a radio frequency (RF) microscope.

2. Related Art

The operation of electronic components may be affected by a number of degradation modes that result in integrity issues for the electronic components, such as errors, faults, and failures. Such degradation modes may require a variety of techniques for accurate characterization and analysis. In particular, visible degradation in the form of broken solder joints, broken connectors, delamination, and/or thermal deformation or scorching may be detected through unaided visual examination of the electronic components.

On the other hand, some degradation modes may be too small to observe with the naked eye and may require the use of a magnifying glass, microscope, high-resolution photography, and/or high-resolution X-rays. Such microscopic degradation modes may include hairline cracks in conductors, partial-penetration solder cracks, tin whiskers in lead-free solder, and/or electromigration.

Moreover, current techniques for analyzing microscopic degradation modes may require exposing the phenomenon of interest for optical viewing. Such techniques may further involve the significant use of human resources and/or destruction of the component(s) under analysis. For example, electromigration phenomena inside the internal metal layers of a packaged computer chip may only be examined after removing the packaging (e.g., through cutting, grinding, and/or acid etching) and properly positioning the computer chip underneath a microscope.

Hence, what is needed is a technique for analyzing and magnifying microscopic degradation modes in electrical components without the above-described problems.

SUMMARY

One embodiment provides a technique for analyzing a target electromagnetic signal radiating from a monitored system. During the technique, the monitored system is positioned at a first locus of an ellipsoidal surface to amplify the target electromagnetic signal received at a second locus of the ellipsoidal surface. Next, the amplified target electromagnetic signal is monitored using an antenna positioned at the second locus of the ellipsoidal surface. Finally, the integrity of the monitored system is assessed by analyzing the amplified target electromagnetic signal monitored by the antenna.

In some embodiments, the target electromagnetic signal is generated by executing a load script on the monitored system.

In some embodiments, positioning the monitored system at the first locus of the ellipsoidal surface involves placing the monitored system on a programmable positioning table and horizontally moving the programmable positioning table to position one or more components in the monitored system at the first locus.

In some embodiments, analyzing the amplified target electromagnetic signal involves analyzing the amplified target electromagnetic signal radiating from the one or more components at the first locus.

In some embodiments, the ellipsoidal surface comprises a smooth metallic reflective surface.

In some embodiments, the ellipsoidal surface comprises an upper hemisphere of an ellipsoid.

In some embodiments, the ellipsoidal surface further comprises at least a portion of a lower hemisphere of the ellipsoid.

In some embodiments, analyzing the amplified target electromagnetic signal involves:
  (i) generating a target electromagnetic-signal fingerprint from the amplified target electromagnetic signal;
  (ii) feeding the target electromagnetic-signal fingerprint into a pattern-recognition model;
  (iii) producing an estimated electromagnetic-signal fingerprint using the pattern-recognition model; and
  (iv) comparing the target electromagnetic-signal fingerprint to the estimated electromagnetic-signal fingerprint.

In some embodiments, the antenna comprises a near-isotropic antenna.

In some embodiments, assessing the integrity of the monitored system involves at least one of:
  (i) assessing an authenticity of one or more components in the monitored system;
  (ii) detecting a presence of metal whiskers in the monitored system;
  (iii) detecting electromigration in the monitored system;
  (iv) detecting electromechanical degradation in the monitored system; and
  (v) detecting electrical connection degradation in the monitored system.

BRIEF DESCRIPTION OF THE FIGURES

In the figures, like reference numerals refer to the same figure elements.

DETAILED DESCRIPTION

Figure 1:
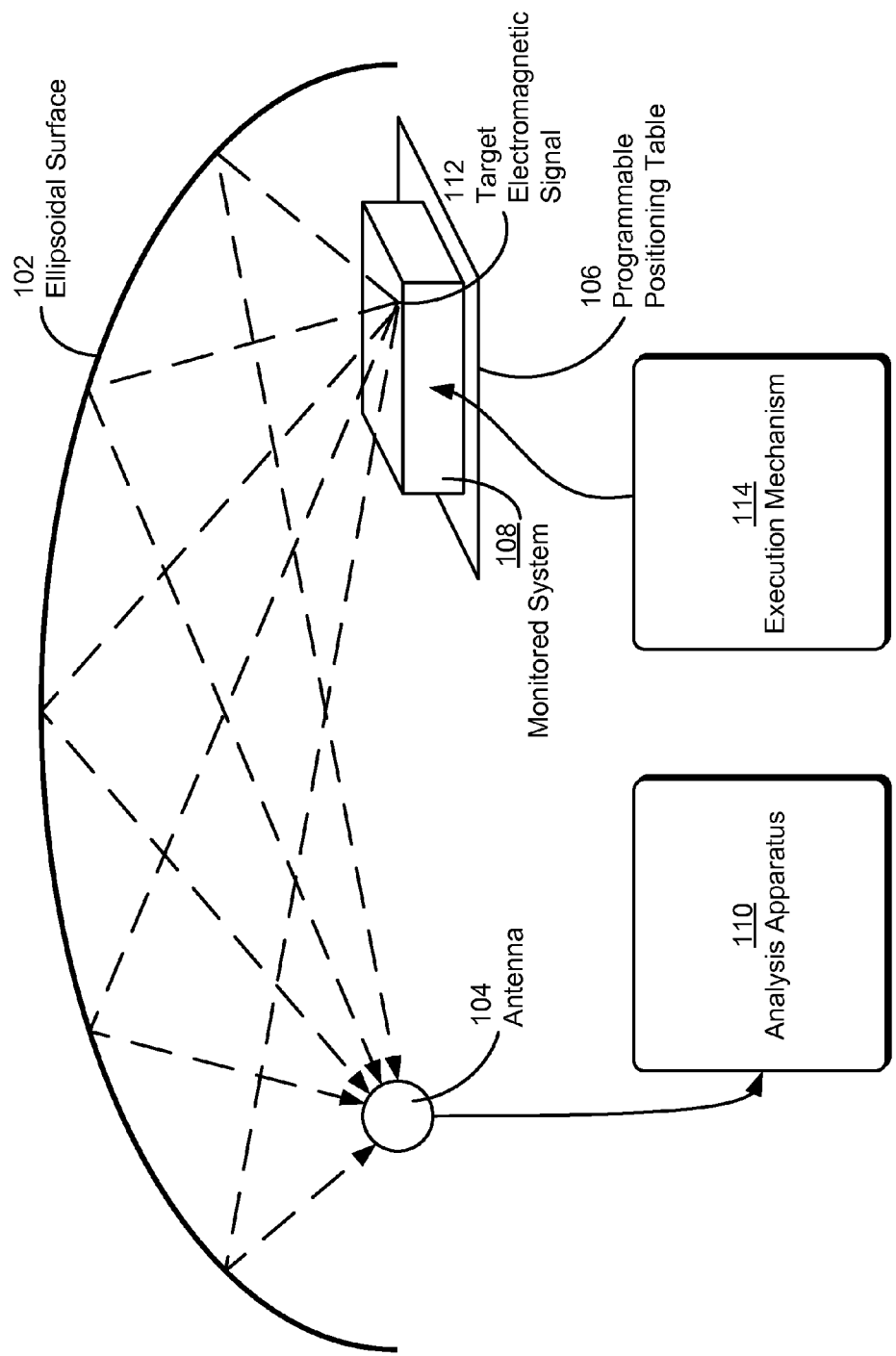
FIG. 1 shows a schematic of a system in accordance with an embodiment.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing instructions and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Embodiments provide a method and system for monitoring a target electromagnetic signal radiating from a monitored system. The monitored system may correspond to an electronic system such as a computer system, a medical electronic system, a consumer electronic system (e.g., television, stereo, game consol, etc.), and/or an aerospace electronic system. An antenna may be used to monitor the target electromagnetic signal from one or more components of the monitored system. The target electromagnetic signal may then be analyzed to assess the integrity of the monitored system.

More specifically, embodiments provide a radio frequency (RF) microscope for amplifying the target electromagnetic signal from the monitored system. The RF microscope may include an ellipsoidal surface, such as a smooth metallic reflective surface, that is used to amplify the target electromagnetic signal. To amplify the signal, the monitored system is placed at one locus of the ellipsoidal surface, and an antenna is placed at another locus of the ellipsoidal surface. The target electromagnetic signal may then radiate from the monitored system, reflect off the ellipsoidal surface, and converge onto the antenna. Embodiments may thus facilitate detailed characterization of the monitored system by significantly amplifying the target electromagnetic signal received by the antenna.

FIG. 1 shows a schematic of a system in accordance with an embodiment. As shown in FIG. 1, the system includes an ellipsoidal surface 102, an antenna 104, a programmable positioning table 106, an analysis apparatus 110, and an execution mechanism 114. The system may be used to characterize a monitored system 108, such as a computer system, a consumer electronics device, an aerospace electronic system, and/or another system that includes electronic components. In particular, the system of FIG. 1 may be used to characterize monitored system 108 by monitoring and analyzing a target electromagnetic signal 112 radiating from monitored system 108.

Target electromagnetic signal 112 may be generated by monitored system 108 during operation. Furthermore, target electromagnetic signal 112 may carry information that is used to generate unique fingerprints for components within monitored system 108. For example, target electromagnetic signal 112 generated by a processor in monitored system 108 may be converted into a digitized time series signal and analyzed using a pattern-recognition model to characterize the operational health and/or authenticity of one or more components in monitored system 108.

In one or more embodiments, target electromagnetic signal 112 is generated by executing a load script on monitored system 108. In particular, execution mechanism 114 may execute the load script on one or more processors (e.g., microprocessors, microcontrollers, central processing units (CPUs), graphics-processing units (GPUs), programmable-logic controllers (PLCs), etc.) in monitored system 108 as a sequence of instructions that produces a load profile that oscillates between specified processor utilization percentages. Alternatively, execution mechanism 114 may execute the load script as a sequence of instructions that produce a customized load profile. As a result, the load script may correspond to a dynamic load script that changes the load on the processor(s) as a function of time.

In one or more embodiments, antenna 104 is used to monitor target electromagnetic signal 112. Antenna 104 may correspond to a dipole antenna, a Yagi-Uda antenna, a loop antenna, an electrical short antenna (e.g., an open-ended wire having a length less than a quarter wavelength), a fractal antenna, a parabolic antenna, a microstrip antenna, a quad antenna, a random wire antenna (e.g., an open-ended wire having a length greater than one wavelength), a beverage antenna, a helical antenna, a phased array antenna, and/or any other type of antenna now known or later developed.

In one or more embodiments, antenna 104 includes an insulated wire with a fixed length of insulation stripped off. The stripped end of the insulated wire may be open to free space and the other end of the wire may be coupled to analysis apparatus 110. In one or more embodiments, the stripped length is approximately ½ inch. Alternatively, the length of the antenna can be selected to achieve optimal discrimination sensitivity and robustness. Furthermore, while many types of antennas may be used to collect electromagnetic signals, stripped wire provides a simple and inexpensive option.

In one or more embodiments, antenna 104 corresponds to a near-isotropic antenna that includes a number of receiving surfaces arranged in a regular polyhedron, such as an icosahedron. The use of a near-isotropic antenna may allow target electromagnetic signal 112 to be received and monitored from virtually any direction. The near-isotropic antenna may further allow target electromagnetic signal 112 as received by each receiving surface to be separately analyzed for anomalies. Near-isotropic antennas for monitoring electromagnetic signals are described in a co-pending non-provisional application by the same inventors as the instant application entitled "Near-Isotropic Antenna for Monitoring Electromagnetic Signals," having Ser. No. 12/474,486, and filing date 29 May 2009, which is incorporated herein by reference.

Those skilled in the art will appreciate that the strength of target electromagnetic signal 112 as monitored by antenna 104 is inversely proportional to the square of the distance between antenna 104 and monitored system 108. As a result, antenna 104 may be limited in the ability to pick up nuances in target electromagnetic signal 112, particularly if antenna 104 is small and/or located a distance away from monitored system 108. The inability of antenna 104 to fully monitor target electromagnetic signal 112 may further preclude finer-grained characterization of monitored system 108 through the analysis of target electromagnetic signal 112. For example, antenna 104 may be unable to monitor target electromagnetic signal 112 to the extent that allows for detection of microscopic anomalies such as tin whiskers, hair-line cracks in conductors, partial-penetration solder-ball cracks, and/or electromigration within monitored system 108.

To facilitate the monitoring of target electromagnetic signal 112 by antenna 104, antenna 104 and monitored system 108 may be placed underneath ellipsoidal surface 102. Ellipsoidal surface 102 may correspond to an ellipsoidally shaped, smooth metallic reflective surface that amplifies target electromagnetic signal 112 as received by antenna 104. To amplify the reception of target electromagnetic signal 112 by antenna 104, monitored system 108 may be positioned at a first locus of ellipsoidal surface 102, and antenna 104 may be placed at a second locus of ellipsoidal surface 102. Due to the physical properties of ellipsoidal surface 102, energy transmissions (e.g., electromagnetic waves) originating from one locus of ellipsoidal surface 102 may reflect off ellipsoidal surface 102 and converge exactly at the other locus of ellipsoidal surface 102. As a result, amplification of target electromagnetic signal 112 may occur as target electromagnetic signal 112 radiates from the portion of monitored system 108 located at the first locus of ellipsoidal surface 102, reflects off ellipsoidal surface 102, and converges at the second locus of ellipsoidal surface 102, where antenna 104 is located.

In one or more embodiments, ellipsoidal surface 102 corresponds to the upper hemisphere of an ellipsoid. In other words, ellipsoidal surface 102 may be an ellipsoidal dome that amplifies target electromagnetic signal 112 radiating from one locus of the ellipsoidal dome for an antenna 104 located at the other locus of the ellipsoidal dome. For example, an ellipsoidal dome with a major axis of four feet and a minor axis of 3.2 feet. The first locus and second locus may be separated by 2.4 feet within the ellipsoidal dome, and target electromagnetic signal 112 may have a wavelength of 1.5 feet and a frequency of 655 Megahertz. The ellipsoidal dome may thus amplify target electromagnetic signal 112 monitored by a one-inch antenna 104 by a factor of 14,482 when target electromagnetic signal 112 originates from one locus of the ellipsoidal dome and antenna 104 is placed at the other locus of the ellipsoidal dome.

Ellipsoidal surface 102 may also include some or all of the lower hemisphere of the ellipsoid. For example, ellipsoidal surface 102 may fully enclose antenna 104 and monitored system 108, resulting in a magnification factor of over 28,000 in target electromagnetic signal 112 as received by antenna 104 if ellipsoidal surface 102 includes the dimensions described above. The magnification factor may be increased even more using larger ellipsoidal surfaces.

Consequently, information that may be lost in the unamplified transmission of target electromagnetic signal 112 from monitored system 108 to antenna 104 (e.g., without the use of ellipsoidal surface 102) may easily be conveyed to antenna 104 by the amplification of target electromagnetic signal 112 using ellipsoidal surface 102. In other words, ellipsoidal surface 102 may act as a radio frequency (RF) microscope that facilitates the monitoring of target electromagnetic signal 112 by concentrating target electromagnetic signal 112 onto antenna 104.

Furthermore, the size and/or dimensions of ellipsoidal surface 102 may be configured to accommodate different types and sizes of monitored systems and/or antennas within ellipsoidal surface 102. For example, a larger ellipsoidal surface 102 may be used as an RF microscope for monitored systems such as computer servers, flat-screen televisions, and/or large system boards, while a smaller ellipsoidal surface 102 may be used as an RF microscope for electronic wristwatches, individual electronic components, and/or portable electronic devices (e.g., mobile phones, portable media players, digital cameras, etc.). Along the same lines, the dimensions of ellipsoidal surface 102 may be configured to enable oddly shaped monitored systems and/or antennas to fit inside ellipsoidal surface 102.

As shown in FIG. 1, monitored system 108 is placed in programmable positioning table 106 within ellipsoidal surface 102. Programmable positioning table 106 may facilitate the transmission of target electromagnetic signal 112 at the first locus of ellipsoidal surface 102 by controlling and updating the position of monitored system 108 within ellipsoidal surface 102. For example, programmable positioning table 106 may include a servomechanism that horizontally moves programmable positioning table 106 to position a component in monitored system 108 at the first locus. The servomechanism may also be programmed to sequentially position a number of components (e.g., processors, input/output (I/O) devices, electromechanical components, etc.) in monitored system 108 at the first locus based on a predetermined layout of components inside monitored system 108 (e.g., based on design documents).

The sequential positioning of components at the first locus may allow antenna 104 to monitor the amplified target electromagnetic signal 112 from each component. Moreover, execution mechanism 114 may cause the load script to be executed as a component in monitored system 108 is newly positioned at the first locus so that target electromagnetic signal 112 is radiated from the component and amplified at antenna 104.

The component may then be characterized by analyzing the component's amplified target electromagnetic signal 112 as monitored by antenna 104. Other components of monitored system 108 may similarly be characterized by horizontally moving programmable positioning table 106 to position each of the other components at the first locus, collecting the amplified target electromagnetic signal 112 using antenna 104, and analyzing the amplified target electromagnetic signal 112.

In one or more embodiments, the amplified target electromagnetic signal 112 received by antenna 104 is analyzed by analysis apparatus 110. In particular, analysis apparatus 110 may analyze the amplified target electromagnetic signal 112 to assess the integrity of monitored system 108. For example, analysis apparatus 110 may assess the integrity of monitored system 108 by determining the authenticity of one or more components, the presence and length of metal whiskers, the presence of electromigration, the presence of electromechanical degradation, and/or the presence of electrical connection degradation in one or more components in monitored system 108.

Furthermore, the analysis techniques that may be used by analysis apparatus 110 to analyze the amplified target electromagnetic signal 112 are described in the following: U.S. patent application entitled "Using EMI Signals to Facilitate Proactive Fault Monitoring in Computer Systems," by Kenny C. Gross, Aleksey M. Urmanov, Ramakrishna C. Dhanekula and Steven F. Zwinger, application Ser. No. 11/787,003, filed 12 Apr. 2007, which is hereby fully incorporated by reference; U.S. patent application entitled "Method and Apparatus for Generating an EMI Fingerprint for a Computer System," by Kenny C. Gross, Aleksey M. Urmanov, and Ramakrishna C. Dhanekula, application Ser. No. 11/787,027, filed 12 Apr. 2007, which is hereby fully incorporated by reference; U.S. patent application entitled "Accurately Inferring Physical Variable Values Associated with Operation of a Computer System," by Ramakrishna C. Dhanekula, Kenny C. Gross, and Aleksey M. Urmanov, application Ser. No. 12/001,369, filed 10 Dec. 2007, which is hereby fully incorporated by reference; U.S. patent application entitled "Proactive Detection of Metal Whiskers in Computer Systems," by Ramakrishna C. Dhanekula, Kenny C. Gross, and David K. McElfresh, application Ser. No. 11/985,288, filed 13 Nov. 2007, which is hereby fully incorporated by reference; U.S. patent application entitled "Detecting Counterfeit Electronic Components Using EMI Telemetric Fingerprints," by Kenny C. Gross, Ramakrishna C. Dhanekula, and Andrew J. Lewis, application Ser. No. 11/974,788, filed 16 Oct. 2007, which is hereby fully incorporated by reference; and U.S. patent application entitled "Determining a Total Length for Conductive Whiskers in Computer Systems," by David K. McElfresh, Kenny C. Gross, and Ramakrishna C. Dhanekula, Attorney Docket No. SUN08-0122, application Ser. No. 12/126,612, filed 23 May 2008, which is hereby fully incorporated by reference.

Figure 2:
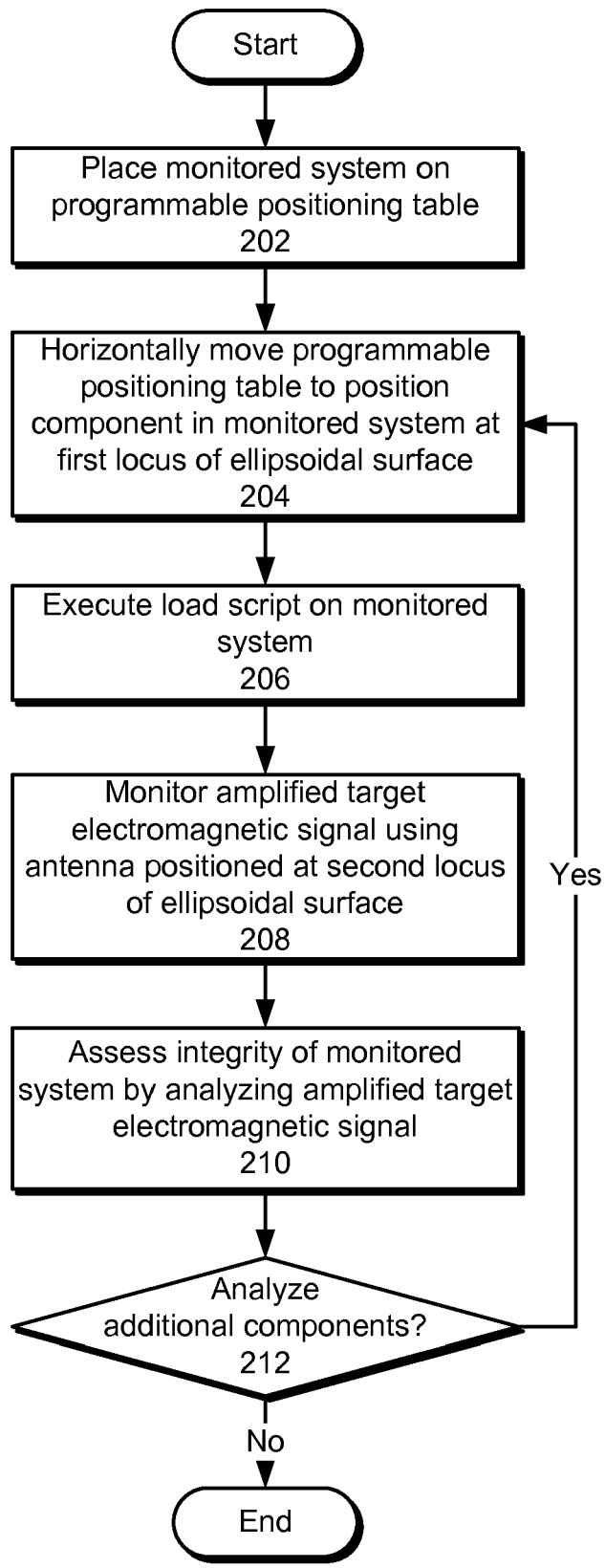
FIG. 2 shows a flowchart illustrating the process of analyzing a target electromagnetic signal radiating from a monitored system in accordance with an embodiment.

FIG. 2 shows a flowchart illustrating the process of analyzing a target electromagnetic signal radiating from a monitored system in accordance with an embodiment. In one or more embodiments, one or more of the steps may be omitted, repeated, and/or performed in a different order. Accordingly, the specific arrangement of steps shown in FIG. 2 should not be construed as limiting the scope of the technique.

Initially, the monitored system is placed on a programmable positioning table (operation 202). The programmable positioning table may include a servomechanism that updates the horizontal position of the monitored system. In particular, the programmable positioning table may be horizontally moved to position a component in the monitored system at a first locus of an ellipsoidal surface (operation 204). As described above, the ellipsoidal surface may function as an RF microscope that amplifies a target electromagnetic signal radiating from the monitored system. Furthermore, the ellipsoidal surface may correspond to a smooth metallic reflective surface that forms some or all of an ellipsoid.

To generate the target electromagnetic signal, a load script is executed on the monitored system (operation 206). The load script may correspond to a dynamic load script that changes the load on one or more processors in the monitored system as a function of time. Alternatively, the target electromagnetic signal may be generated through normal operation of the monitored system. For example, the target electromagnetic signal may be generated by timekeeping operations performed by an electronic wristwatch, image capture operations performed by a digital camera or camcorder, and/or media playback operations performed by a portable media player.

Because the monitored system is positioned at the first locus of the ellipsoidal surface, the target electromagnetic signal radiating from the monitored system may reflect off the ellipsoidal surface and converge at the second locus of the ellipsoidal surface. Furthermore, an antenna may be positioned at the second locus to monitor the amplified electromagnetic signal (operation 208). Because the amplified target electromagnetic signal is much stronger than an unamplified target electromagnetic signal transmitted from the monitored system to the antenna (e.g., without the ellipsoidal surface), the amplified target electromagnetic signal may transmit detailed information regarding the state of the monitored system to the antenna.

Such detailed information may be used in an integrity assessment of the monitored system that analyzes the amplified target electromagnetic signal (operation 210). Analysis of the amplified target electromagnetic signal is described below with respect to FIG. 3 and in the above-referenced applications. In particular, the amplified target electromagnetic signal may be analyzed to assess the authenticity of the component positioned at the first locus of the ellipsoidal surface, detect the presence of metal whiskers in the monitored system, detect electromigration in the monitored system, detect electromechanical degradation in the monitored system, and/or detect electrical connection degradation in the monitored system. For example, the amplified target electromagnetic signal may be used to determine the authenticity of a high-end electronic wristwatch, detect faults in a computer server, and/or monitor degradation in electrical connections within an electronic gaming console.

The analysis of the target electromechanical signal may also be applied to additional components in the monitored system (operation 212). For example, the integrity of the monitored system may be assessed based on the amplified target electromagnetic signal monitored from some or all of the components (e.g., processors, I/O devices, electromechanical components, etc.) in the monitored system. If additional components are to be analyzed, the programmable positioning table is horizontally moved to position a different component at the first locus of the ellipsoidal surface (operation 204).

While the component is positioned at the first locus, the target electromagnetic signal is generated by executing a load script on the monitored system (operation 206) and/or by operating the monitored system normally. Next, the target electromagnetic signal is amplified and monitored by the antenna at the second locus of the ellipsoidal surface (operation 208), and the integrity of the monitored system is assessed by analyzing the amplified target electromagnetic signal monitored by the antenna (operation 210). Operations 204-210 may continue until the integrity of the monitored system has been assessed with respect to all relevant components in the monitored system.

Figure 3:
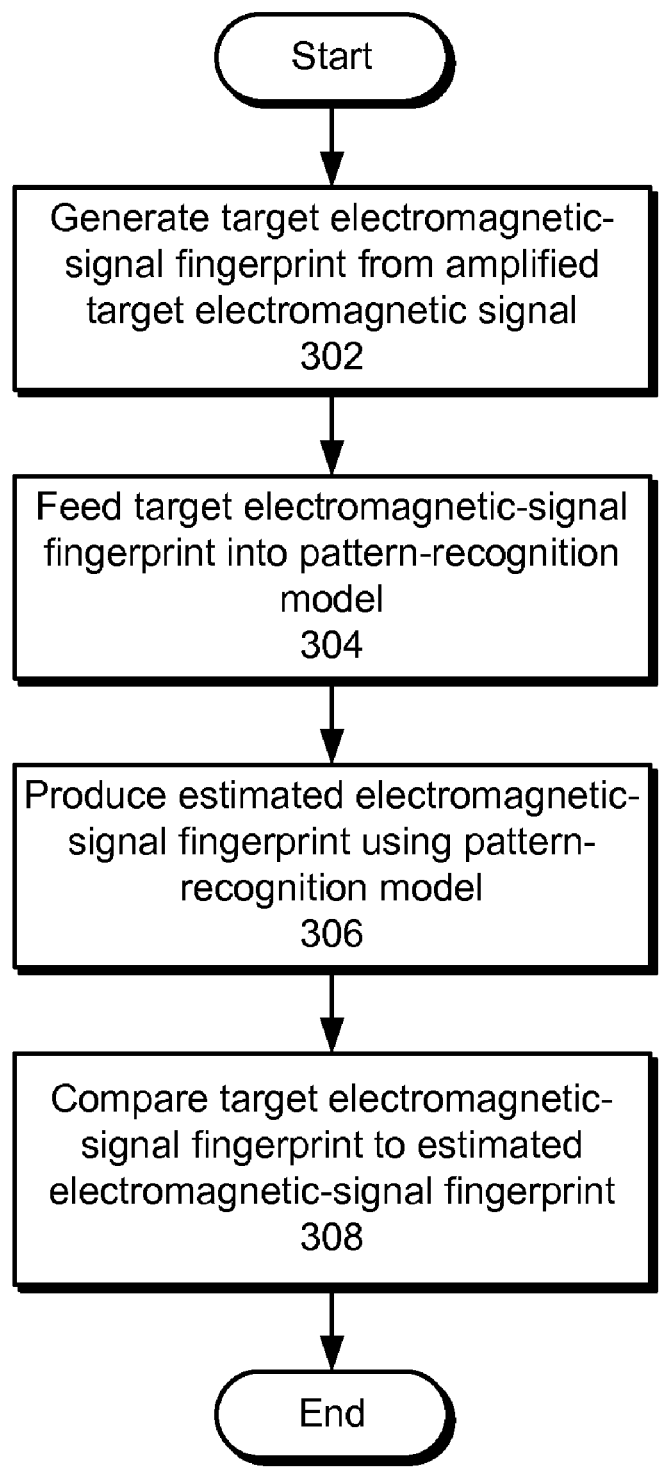
FIG. 3 shows a flowchart illustrating the process of analyzing an amplified target electromagnetic signal in accordance with an embodiment.

FIG. 3 shows a flowchart illustrating the process of analyzing an amplified target electromagnetic signal in accordance with an embodiment. In one or more embodiments, one or more of the steps may be omitted, repeated, and/or performed in a different order. Accordingly, the specific arrangement of steps shown in FIG. 3 should not be construed as limiting the scope of the technique.

First, a target electromagnetic-signal fingerprint is generated from the amplified target electromagnetic signal (operation 302). The amplified target electromagnetic signal may be monitored and collected as an electromagnetic-signal time-series by an antenna. Because the amplified target electromagnetic signal is several orders of magnitude stronger than an unamplified target electromagnetic signal, the target electromagnetic-signal fingerprint may contain significantly more detail than a target electromagnetic-signal fingerprint generated from an unamplified target electromagnetic signal.

In one or more embodiments, the target electromagnetic-signal fingerprint is generated by: (1) transforming the monitored electromagnetic-signal time-series from the time-domain to the frequency-domain; (2) for each of a set of N frequencies in a reference electromagnetic-signal fingerprint associated with the amplified target electromagnetic signal, generating a monitored electromagnetic-signal amplitude-time series based on the frequency-domain representation of the monitored electromagnetic signal collected over time; and (3) forming the target electromagnetic-signal fingerprint using the set of N monitored electromagnetic-signal amplitude-time series associated with the selected N frequencies.

Next, the target electromagnetic-signal fingerprint is fed as input to a pattern-recognition model (operation 304). In one or more embodiments, the pattern-recognition model corresponds to a non-linear, non-parametric (NLNP) regression model. In addition, the pattern-recognition model may be generated from the reference electromagnetic-signal fingerprint, as described in the above-referenced applications.

In one or more embodiments, the NLNP regression technique includes a multivariate state estimation technique (MSET). The term "MSET" as used in this specification may refer to a class of pattern-recognition algorithms. For example, see [Gribok] "Use of Kernel Based Techniques for Sensor Validation in Nuclear Power Plants," by Andrei V. Gribok, J. Wesley Hines, and Robert E. Uhrig, *The Third American Nuclear Society International Topical Meeting on Nuclear Plant Instrumentation and Control and Human-Machine Interface Technologies*, Washington D.C., Nov. 13-17, 2000. This paper outlines several different pattern-recognition approaches. Hence, the term "MSET" as used in this specification may refer to (among other things) any technique outlined in [Gribok], including ordinary least squares (OLS), support vector machines (SVM), artificial neural networks (ANNs), MSET, or regularized MSET (RMSET).

An estimated electromagnetic-signal fingerprint is then produced using the pattern-recognition model (operation 306). The estimated electromagnetic-signal fingerprint may include a set of N estimated electromagnetic-signal amplitude-time series corresponding to the set of N monitored electromagnetic-signal amplitude-time series in the target electromagnetic-signal fingerprint.

Finally, the target electromagnetic-signal fingerprint is compared to the estimated electromagnetic-signal fingerprint (operation 308). Specifically, for each of the selected N frequencies, a residual signal is computed between a monitored electromagnetic-signal amplitude-time series in the target electromagnetic-signal fingerprint and a corresponding estimated electromagnetic-signal amplitude-time series in the estimated electromagnetic-signal fingerprint. A sequential-analysis technique such as a sequential probability ratio test (SPRT) may then be applied to the residual signal to detect a statistical deviation in the residual signal. As discussed in the above-referenced applications, the presence of a statistical deviation in the residual signal may indicate the presence of metal whiskers, electromigration, electromechanical degradation, electrical connection degradation, lack of authenticity, and/or other integrity issues associated with the component from which the amplified target electromagnetic signal is obtained.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method for analyzing a target electromagnetic signal radiating from a monitored system, comprising:
   positioning the monitored system at a first locus of an ellipsoidal surface to amplify the target electromagnetic signal received at a second locus of the ellipsoidal surface;
   monitoring the amplified target electromagnetic signal using an antenna positioned at the second locus of the ellipsoidal surface; and
   assessing the integrity of the monitored system by analyzing the amplified target electromagnetic signal monitored by the antenna,
   wherein the first locus and the second locus are at opposing focal points of the ellipsoidal surface.

2. The method of claim 1, wherein the target electromagnetic signal is generated by executing a load script on the monitored system.

3. The method of claim 1, wherein positioning the monitored system at the first locus of the ellipsoidal surface involves:
   placing the monitored system on a programmable positioning table; and
   horizontally moving the programmable positioning table to position one or more components in the monitored system at the first locus.

4. The method of claim 3, wherein analyzing the amplified target electromagnetic signal involves:
   analyzing the amplified target electromagnetic signal radiating from the one or more components at the first locus.

5. The method of claim 1, wherein the ellipsoidal surface comprises a smooth metallic reflective surface.

6. The method of claim 1, wherein the ellipsoidal surface comprises an upper hemisphere of an ellipsoid.

7. The method of claim 6, wherein the ellipsoidal surface further comprises at least a portion of a lower hemisphere of the ellipsoid.

8. The method of claim 1, wherein analyzing the amplified target electromagnetic signal involves:
   generating a target electromagnetic-signal fingerprint from the amplified target electromagnetic signal;
   feeding the target electromagnetic-signal fingerprint into a pattern-recognition model;
   producing an estimated electromagnetic-signal fingerprint using the pattern-recognition model; and
   comparing the target electromagnetic-signal fingerprint to the estimated electromagnetic-signal fingerprint.

9. The method of claim 1, wherein the antenna comprises a near-isotropic antenna.

10. The method of claim 1, wherein assessing the integrity of the monitored system involves at least one of:
    assessing an authenticity of one or more components in the monitored system;
    detecting a presence of metal whiskers in the monitored system;
    detecting electromigration in the monitored system;
    detecting electromechanical degradation in the monitored system; and
    detecting electrical connection degradation in the monitored system.

11. A system for analyzing a target electromagnetic signal radiating from a monitored system, comprising:
    an ellipsoidal surface;
    a positioning apparatus configured to position the monitored system at a first locus of the ellipsoidal surface to amplify the target electromagnetic signal received at a second locus of the ellipsoidal surface;
    an antenna positioned at the second locus of the ellipsoidal surface, wherein the antenna is configured to monitor the amplified target electromagnetic signal; and
    an analysis apparatus configured to assess the integrity of the monitored system by analyzing the amplified target electromagnetic signal monitored by the antenna,
    wherein the first locus and the second locus are at opposing focal points of the ellipsoidal surface.

12. The system of claim 11, further comprising:
    an execution mechanism configured to generate the target electromagnetic signal by executing a load script on the monitored system.

13. The system of claim 11,
    wherein the positioning apparatus corresponds to a programmable positioning table, and wherein positioning the monitored system at the first locus of the ellipsoidal surface involves horizontally moving the programmable positioning table to position one or more components in the monitored system at the first locus.

14. The system of claim 13, wherein analyzing the amplified target electromagnetic signal involves:

analyzing the amplified target electromagnetic signal radiating from the one or more components at the first locus.

15. The system of claim 11, wherein the ellipsoidal surface comprises a smooth metallic reflective surface.

16. The system of claim 11, wherein the ellipsoidal surface comprises an upper hemisphere of an ellipsoid.

17. The system of claim 16, wherein the ellipsoidal surface further comprises at least a portion of a lower hemisphere of the ellipsoid.

18. The system of claim 11, wherein analyzing the amplified target electromagnetic signal involves:

generating a target electromagnetic-signal fingerprint from the amplified target electromagnetic signal;

feeding the target electromagnetic-signal fingerprint into a pattern-recognition model;

producing an estimated electromagnetic-signal fingerprint using the pattern-recognition model; and comparing the target electromagnetic-signal fingerprint to the estimated electromagnetic-signal fingerprint.

19. The system of claim 11, wherein the antenna comprises a near-isotropic antenna.

20. The system of claim 11, wherein assessing the integrity of the monitored system involves at least one of:

assessing an authenticity of one or more components in the monitored system;

detecting a presence of metal whiskers in the monitored system;

detecting electromigration in the monitored system;

detecting electromechanical degradation in the monitored system; and detecting electrical connection degradation in the monitored system.

21. The method of claim 7, wherein the ellipsoidal surface fully encloses the antenna and the monitored system.

* * * * *